(12) United States Patent
Bösch et al.

(10) Patent No.: US 9,640,688 B2
(45) Date of Patent: May 2, 2017

(54) SOLAR CELL ASSEMBLY AND ALSO SOLAR CELL ARRANGEMENT

(75) Inventors: Armin Bösch, Ebringen (DE); Joachim Jaus, Freiburg (DE); Andreas Bett, Freiburg (DE); Gerhard Peharz, Freiburg (DE); Peter Nitz, Gundelfingen (DE); Thomas Schmidt, Freiburg (DE)

(73) Assignee: Fraunhofer-Gesellschaft zur Förderung der angewandten Forschung e.V., München (DE)

( * ) Notice: Subject to any disclaimer, the term of this patent is extended or adjusted under 35 U.S.C. 154(b) by 0 days.

(21) Appl. No.: 13/386,292

(22) PCT Filed: Jul. 19, 2010

(86) PCT No.: PCT/EP2010/004394
§ 371 (c)(1),
(2), (4) Date: Apr. 3, 2012

(87) PCT Pub. No.: WO2011/009580
PCT Pub. Date: Jan. 27, 2011

(65) Prior Publication Data
US 2012/0187439 A1 Jul. 26, 2012

(30) Foreign Application Priority Data
Jul. 20, 2009 (EP) ..................... 09009379

(51) Int. Cl.
*H01L 33/52* (2010.01)
*H01L 31/048* (2014.01)
(Continued)

(52) U.S. Cl.
CPC ...... *H01L 31/048* (2013.01); *H01L 31/02008* (2013.01); *H01L 31/0236* (2013.01); *H01L 31/0543* (2014.12); *Y02E 10/52* (2013.01)

(58) Field of Classification Search
USPC ............... 136/246, 251, 259; 257/428, 431, 257/E31.001, E31.11, E31.117, E31.119,
(Continued)

(56) References Cited

U.S. PATENT DOCUMENTS 4,235,643 A * 11/1980 Amick .................... 136/246
4,830,678 A * 5/1989 Todorof et al. .......... 136/259
(Continued)

FOREIGN PATENT DOCUMENTS

CN 201167096 Y 12/2008
JP 2001-036115 A 2/2001
WO WO-2009080354 A1 7/2009

OTHER PUBLICATIONS

Wayback machine, capture of Präzisions Glas & Optik, "PYREX Transmission Curve", capture for Mar. 15, 2006, https://web.archive.org/web/20060315065134/http://www.pgo-online.com/intl/katalog/curves/pyrex_kurve.html, accessed May 27, 2016.*

(Continued)

*Primary Examiner* — Peter Bradford
(74) *Attorney, Agent, or Firm* — Schwegman Lundberg & Woessner, P.A.

(57) ABSTRACT

A light-absorbing or light-emitting solar cell assembly comprises an electrical insulator disposed on an electrically conductive substrate and that is provided with a metallized surface and at least one solar cell connected to the electrically conductive substrate, wherein the solar cell includes refractive secondary optics and is disposed in a recess in the insulator. The solar cell is connected to the substrate by the side orientated towards the substrate via an electrically conductive connection and the recess is dimensioned such that an interspace is produced laterally between the solar cell and the electrical insulator, the interspace being filled with (Continued)

a coupling medium and the solar cell being connected to the metallized surface by at least one electrical contact.

24 Claims, 3 Drawing Sheets

(51) Int. Cl.
*H01L 31/02* (2006.01)
*H01L 31/0236* (2006.01)
*H01L 31/054* (2014.01)

(58) Field of Classification Search
USPC .............................................. 257/98; 427/74
See application file for complete search history.

(56) References Cited

U.S. PATENT DOCUMENTS

| | | | |
|---|---|---|---|
| 5,167,724 A | | 12/1992 | Chiang |
| 6,051,776 A | * | 4/2000 | Kimata ................. H01L 31/052 126/624 |
| 6,252,155 B1 | * | 6/2001 | Ortabasi ....................... 136/246 |
| 6,515,269 B1 | * | 2/2003 | Webster et al. ............. 250/208.1 |
| 6,586,824 B1 | * | 7/2003 | Glenn et al. .................... 257/680 |
| 6,614,103 B1 | * | 9/2003 | Durocher et al. ............. 257/678 |
| 6,674,159 B1 | * | 1/2004 | Peterson et al. .............. 257/680 |
| 2003/0071269 A1 | * | 4/2003 | Tseng ............................. 257/98 |
| 2007/0108463 A1 | * | 5/2007 | Chua et al. .................... 257/100 |
| 2007/0226995 A1 | * | 10/2007 | Bone .............................. 29/832 |
| 2007/0251568 A1 | * | 11/2007 | Maeda ............... G02B 19/0042 136/246 |
| 2007/0292697 A1 | * | 12/2007 | Nakayoshi et al. ........... 428/450 |
| 2008/0083964 A1 | * | 4/2008 | Fujimoto et al. ............. 257/432 |
| 2008/0087323 A1 | * | 4/2008 | Araki et al. ................... 136/256 |
| 2009/0096078 A1 | * | 4/2009 | Chou et al. .................... 257/687 |
| 2009/0120500 A1 | * | 5/2009 | Prather et al. ................ 136/259 |
| 2009/0159128 A1 | * | 6/2009 | Shook et al. ................. 136/259 |
| 2010/0037935 A1 | * | 2/2010 | Vaid ................. H01L 31/02168 136/246 |
| 2010/0218806 A1 | * | 9/2010 | Arab et al. .................... 136/246 |
| 2011/0048535 A1 | * | 3/2011 | Nagyvary ......... H01L 31/02008 136/259 |
| 2011/0127546 A1 | | 6/2011 | Jaus et al. |

OTHER PUBLICATIONS

Professor Darin W. Toohey, solar spectrum, http://paos.colorado.edu/~toohey/Fig_19.jpg, accessed May 27, 2016.*
"International Application No. PCT/EP2010/004394, International Preliminary Report on Patentability mailed Feb. 2, 2012", 5 pgs.
"International Application No. PCT/EP2010/004394, International Search Report and Written Opinion mailed Oct. 21, 2010", (Oct. 21, 2010), 10 pgs.
"Japanese Application Serial No. 2012-520942, Office Action mailed Oct. 9, 2014", (w/ English Translation), 4 pgs.
"Chinese Application Serial No. 201080033440.7, Office Action mailed Jan. 30, 2014", (w/ English Translation), 32 pgs.
"Chinese Application Serial No. 201080033440.7, Office Action mailed Aug. 11, 2014", (w/ English Translation), 31 pgs.
"Japanese Application Serial No. 2012-520942, Office Action mailed Jan. 21, 2014", (English Translation), 18 pgs.
"Machine Translation of JP 2001-036115A, published Feb. 9, 2001", 12 pgs.
"Chinese Application Serial No. 201080033440.7, Office Action mailed Jan. 22, 2015", (w/ English Translation), 10 pgs.
"European Patent Office Application No. 10734704.9, Response filed Dec. 7, 2015 to Office Action mailed Aug. 10, 2015", 15 pg.
"Korean Application Serial No. 10-2012-7001725, Office Action dated Jan. 19, 2016", (w/ English Translation), 15 pgs.
"Japanese Application Serial No. 2012-023509, Office Action mailed Dec. 11, 2015", w/ English Translation, (Dec. 11, 2015), 4 pgs.
"Pyrex", https://en.wikipedia.org/wiki/Pyrex, (Aug. 30, 2016), 4 pgs.
"European Patent Office Application No. 10 734 704.9, Communication pursuant to Article 94(3) EPC mailed Aug. 10, 2015", (Aug. 10, 2015), 4 pgs.

\* cited by examiner

SOLAR CELL ASSEMBLY AND ALSO SOLAR CELL ARRANGEMENT

PRIORITY CLAIM TO RELATED APPLICATIONS

This application is a national stage application under 35 U.S.C. §371 of PCT/EP2010/004394, filed Jul. 19, 2010, and published as WO 2011/009580 A1 on Jan. 27, 2011, which claims priority to European Application No. 09009379.0, filed Jul. 20, 2009, which applications and publication are incorporated by reference as if reproduced herein and made a part hereof in their entirety, and the benefit of priority of each of which is claimed herein.

The invention relates to a light-absorbing or light-emitting solar cell assembly and also a solar cell arrangement which is constructed from 2 to 10,000 of the solar cell assemblies according to the invention.

In photovoltaics, light is converted into electrical energy by means of solar cells. In the case of concentrating photovoltaics, an optical system (for example with lenses or mirrors) is used and concentrates light onto solar cells. It must thereby be ensured that as much light as possible impinges on the solar cell since light which impinges next to the solar cell cannot be converted into electrical energy.

In a photovoltaic concentrator module, a plurality of solar cells are combined and wired electrically. The solar cells must be protected from moisture and mechanical stresses. For this purpose, solar cells are generally encapsulated. In the present context, encapsulation firstly means enclosing with a material which protects the encapsulated solar cell from damaging influences and, at the same time, impairs the function as little as possible.

In general, concentrator modules can scarcely exploit diffuse light since only direct light (sufficiently parallel) can be concentrated. In addition, a concentrator module must be orientated towards the sun, otherwise concentrating light rays would not impinge on the solar cell. Concentrator modules are mostly therefore mounted on a tracking system which orientates the module towards the sun.

The quotient of optical aperture area and solar cell is termed (geometric) concentration factor. For a concentrator system, a high concentration factor is desirable. In order to produce highly concentrating photovoltaic systems (concentration factor>300), the use of secondary optics is possible. A two-stage optical concept is thereby used and consists of a so-called primary optics and a secondary optics. This two-stage concept enables a greater freedom of design in the realization of the optics and the module geometry and permits in addition higher concentration factors or greater tolerances with respect to positioning in manufacture, adjustment and orientation towards the sun. According to the design, the light incident on the receiver surface can in addition be homogenised, i.e. an improvement in the uniformity of the incident intensity can be achieved, which is always jointly present subsequently as a potential advantage of a secondary optics, even if it is not specifically stated.

Secondary optics for concentrator modules are configured for example as a reflective element, however frequently as a refractive element. In the former, the light is directed towards the solar cell by (surface) reflection, in the latter by means of refraction or internal total reflection. Component forms, such as e.g. conically tapering light guides, truncated pyramids, truncated cones, cuboids, cylinders, lenses or parabolas are known for secondary optics.

Also combinations of these forms are known. Refractive secondary optics (the subsequent embodiments relate to this type) must be manufactured from highly transparent materials, such as glass or transparent plastic materials (PMMA, polycarbonate etc.) in order to absorb as little light as possible. Light which is absorbed in the secondary optics cannot be used by the solar cell. In addition, the secondary optics is generally situated in the focus of the primary optics and hence is subjected to concentrated sun radiation. Even low absorption of the concentrated sun radiation can therefore lead to great heating of the secondary optics and ultimately to destruction thereof. According to the connection between the secondary optics and cell, also the cell is heated, which is undesired. In order to avoid optical losses at the interface between secondary optics and solar cell, this region is frequently filled with an optical coupling medium. When using secondary optics which use total internal reflection (TIR), the following problem thereby occurs:

The optical coupling medium can wet the outer surfaces of secondary optics, as a result of which the surface contour is changed such that the conditions for TIR are no longer provided. Thus light is coupled out on these wetted surfaces and no longer impinges on the solar cell. Also the assembly of secondary optics is frequently not easy to resolve. The known methods for mounting generally require additional retaining devices for the secondary optics, by means of which material and process costs are increased.

If encapsulation material is situated in the optical path, the same applies as for the secondary optics material. The material for the solar cell must be highly transparent for solar radiation (300-2,000 nm). Light absorbed in the encapsulation material cannot be converted into electrical energy. In addition, even a low absorption of concentrated sunlight leads to great heating of the material, which can lead to degradation and ultimately destruction thereof. Since the medium is situated in the focus of the primary optics, it is necessary that the material used is in addition stable relative to high doses of radiation.

It is important that the material protects the solar cell from environmental influences, such as e.g. air humidity. For the mentioned reasons, generally transparent silicones are used for the encapsulation. For this purpose, the encapsulation material is applied in the liquid state on and around the cell and subsequently hardened. Furthermore, it is possible that silicone which is used for optical coupling between secondary optics and solar cell also serves for protection of the solar cell edges. The disadvantage in particular of highly transparent silicone is that it adheres only inadequately on many surfaces and is permeable for water vapour. Highly transparent silicones are therefore suitable merely in a limited fashion for the encapsulation of solar cells.

The above-cited state of the art has explicitly the following disadvantages:
- for mounting secondary optics with a larger entrance aperture than outlet aperture, additional mountings are required, which increase the material and process costs for concentrator modules.
- optical coupling media can wet the side surfaces of secondary optics, which leads to coupling out of light when using internal total reflection.
- only highly transparent materials are possible as encapsulation materials. If concentrated solar radiation is absorbed in the encapsulation material, this can lead to destruction of the encapsulation. The use of exclusively highly transparent materials very greatly restricts the material selection.

Apart from the above-described components especially for the concentrating photovoltaics, light diode components (LED) are known from prior art. Similarly to the application of photovoltaic concentrator systems, semiconductor elements are combined with a optics in the case of light diode components, the encapsulation of the electrical elements being ensured at the same time. The present invention is distinct from LED components in the following points:

In the case of LED components, light generally emerges laterally out of the semiconductor. In the case of photovoltaic applications, light enters into the semiconductor via the front-side. This difference is also reflected in the electrical contacting of the semiconductor elements. Whilst in the case of LED technology, the entire front-side serves as contacting surface, it must be ensured in photovoltaics that shading by the contacting is minimal.

In the case of LED applications, fillers in the encapsulation material are used in order to influence the spectrum of the emerging light. In the case of the photovoltaic application, the (illuminated) encapsulation material must be as transparent as possible.

In particular concentrating photovoltaics demand special requirements which are not resolvable with components from LED technology. In contrast to LED applications, the result with concentrating photovoltaics is local light intensities >1,000 kW/m$^2$. If LED components, which are known from prior art, were to be used in concentrating photovoltaics, these would in general be destroyed. In addition, costs play a lesser role generally in LED application than in photovoltaics. In the case of LED components, frequently additional elements (for example holding devices) are therefore used, which would be too expensive for applications in a concentrator module.

Starting herefrom, it is the object of the present invention to improve the optical properties of a concentrator module with the help of a corresponding secondary optics and to make this possible in a more economical manner.

This object is solved by the light-absorbing and/or light-emitting solar cell assemblies and solar cell arrangements described herein and to the solar cell assemblies or solar cell arrangements recited in the claims.

According to the invention, a light-absorbing and/or light-emitting solar cell assembly is provided, which comprises an electrical insulator which is disposed on an electrically conductive substrate and is provided with a metallised surface, and at least one solar cell with a refractive secondary optics which is connected to the electrically conductive substrate, the solar cell being disposed in a recess in the insulator which is provided with the metallised surface and the solar cell being connected to the substrate by the side orientated towards the substrate via an electrically conductive connection and the recess being dimensioned such that an interspace is produced laterally between the solar cell and the electrical insulator provided with the metallised surface, said interspace being filled with a coupling medium and the solar cell being connected to the metallised surface by at least one electrical contact.

The invention thereby includes embodiments in which the solar cell is disposed entirely within the cavity formed by the recess, and also embodiments in which the solar cell partially protrudes beyond the metal surface of the insulator.

By means of the secondary optics proposed here, light which otherwise would impinge next to the solar cell is directed onto the solar cell. Furthermore, light from a larger solid angle can be exploited for the solar cell by means of the secondary optics. As a result of the fact that the solar cell and also possibly the electrical contact are entirely encapsulated, the solar cell is protected above all from dust, moisture, corrosive gases and mechanical stresses, as a result of which the long-term stability of the solar cell assembly is increased.

There can be used here as solar cells for the solar cell assembly (SCA) all known solar cells. Furthermore, also monolithic multiple solar cells, in particular a triple solar cell with a monolithic multiple solar cell, can be used. The solar cells can furthermore be doped with elements from main group III and V.

The subject of the invention resides in improving the known solar cell assemblies by the use of an integrated secondary optics. Advantages of this solar cell assembly are good dissipation of the heat emanating from the solar cell, protection of the solar cell from corrosion, resistance or protection of all elements used against concentrated solar radiation, long-term stability of the overall construction, the use of starting materials which are as economical as possible and also compensation for the thermal stresses arising during operation.

Low material and process costs arise in the process for the production of a solar cell assembly according to the invention with an integrated, refractory secondary optics. Furthermore, high positioning accuracy of the secondary optics relative to the solar cell is ensured and also avoidance of damage to the solar cells, the secondary optics or other elements present on the solar cell assembly in the equipping process.

Preferably, the coupling medium is selected from the group consisting of transparent materials, silicones, silicone oil, polycarbonates, polyacrylates, poly(meth)acrylates, glass, quartz glass, thermoplastic plastics and mixtures hereof. These materials can be metered precisely and can therefore be filled also into narrow regions in an excellent manner.

The coupling medium can also completely encapsulate the solar cell and the electrical contact. As a result, the solar cell and the at least one electrical contact are protected optimally from destructive environmental influences, such as e.g. moisture or corrosive gases. Consequently, the long-term stability of the solar cell assembly according to the invention is increased in this way. Also simplification of manufacture can be made possible thus since the encapsulation medium can be applied in only one operating step.

Furthermore, the electrically conductive connection of the solar cell to the substrate can be effected by means of adhesive, solder, a bond connection and/or welding. These can be applied with positional precision and have high stability.

The metallised surface of the solar cell assembly can consist of metals, in particular copper, silver, nickel, gold, platinum, titanium, palladium, aluminium or germanium alloys or comprise these. These materials are suitable very particularly for contacting and can also serve as wiring pad.

Preferably, the substrate for the solar cell assembly consists of copper, aluminium, titanium, steel, silicon alloys or metal alloys. Optimum heat conduction is ensured by these substrates and enables good dissipation of the heat emanating from the solar cell. Hence destruction of the solar cell assembly as a result of thermal stresses is practically impossible. The substrate can also consist of insulating materials, as are described for example subsequently for the insulator, as long as the surface is electrically conducting. The materials described above are possible as electrically conductive materials for the surface coating.

The electrical insulator preferably consists of epoxy resins, thermoplastic plastics, ceramics, aluminium oxide, polyethylenes, polyvinylchlorides, polytetrafluoroethylenes, silicones or glass. These materials are inert and consequently improve the long-term stability.

In an alternative variant of the invention, the solar cell has, at least on the side connected to the secondary optics, at least one protective coating made of an optically transparent metal, made of aluminium oxide, silicon, silicon oxide, silicon nitride, silicon carbide, polycarbonates, poly(meth)acrylates, silicone, glass, quartz glass or thermoplastic plastics.

Furthermore, the solar cell assembly can be characterised in that the refractive secondary optics for focusing sunlight on the solar cell, comprising a refractor which is configured solidly from an optically transparent dielectric material with an average transmissibility of at least 90% in the wavelength range between 400 and 2,500 nm, measured with a layer thickness of 1 mm, said refractor having an entrance aperture orientated towards the sunlight and an outlet aperture orientated towards the solar cell, the entrance- and/or the outlet aperture being designed such that a refractive concentration of the incident sunlight is effected.

Preferably, the optically transparent dielectric material for the secondary optics is selected from the group consisting of epoxy resin, silicone, silicone resin, polycarbonate, polyacrylates, poly(meth)acrylates, glass, quartz glass, thermoplastic plastics, silicon oxide, silicon carbide, aluminium oxide and mixtures hereof. Because of the resistance to weathering of the compounds which are used and also low absorption of the incident light, the mentioned materials are particularly well suited.

The entrance- and/or outlet aperture of the secondary optics can have a flat, convex and/or concave surface contour. Which surface contour is chosen, depends inter alia upon the materials which are used. The refractive secondary optics can hereby have the most varied of forms, such as e.g. paraboloid, truncated cone, light guide, truncated pyramid etc.

Preferably, the area of the entrance aperture of the secondary optics is greater than the area of the outlet aperture of the secondary optics. The greater the quotient of area of the entrance aperture to area of the exit aperture, the higher is the concentration factor of the secondary lens system.

The refractive secondary optics can have a projection which surrounds the refractor and is disposed preferably at the level of the entrance aperture and, for further preference, is connected monolithically or in a form-fit to the refractor. As a result of the projection, simplification for example during mounting of secondary lens systems by means of Pick & Place methods is made possible since these optics can be gripped by machines in a simple manner.

Furthermore, with the exception of the regions of the entrance- and outlet aperture and/or the side of the projection orientated towards the outlet aperture, the refractor can be coated with a highly reflective coating with a reflection degree ρ>70% in a wavelength range of 400 to 800 nm and/or a reflection degree ρ>80% in a wavelength range of 900 to 2,500 nm. The coating enables excellent concentration of the incident light onto the solar cell without the light impinging on the surroundings of the solar cell. Thus heating and radiation loss, associated therewith, are prevented. Furthermore, also non-transparent encapsulation material can be used.

The highly reflective coating of the secondary optics preferably comprises a metal, in particular aluminium, preferably in a highly pure (>99% by weight) form, or silver, and/or a layer sequence of materials with different refractive indices $n_D^{20}$ and/or alloys or consists of these. This coating or layer sequence can also comprise a protective function or protective layer.

The highly reflective coating of the secondary lens system can have a layer thickness of 1 nm to 3 mm, preferably of 1 μm to 200 μm. As a result, merely a small amount of material is required and nevertheless the reflection and hence the light concentration onto the solar cell is effectively increased.

In an alternative embodiment of the solar cell assembly, the refractor is fixed on the metallised surface by means of a bond by gluing and/or a mechanical fixing. As a result, the stability of the solar cell assembly relative to external conditions is improved in addition.

The material for the formation of the bond can hereby be selected from the group consisting of thermoplastic plastics, epoxy resins, silicones, acrylates, cyanoacrylates, polycarbonates, polyacrylates, poly(meth)acrylates and mixtures hereof. This bond material need not be transparent.

Preferably, the material for the formation of the bond is a thermally conducting material which is electrically insulating. As a result, overheating of the solar cell assembly, on the one hand, and the occurrence of a short circuit, on the other hand, is prevented. The bonding material can furthermore also serve for encapsulation of the electrical contact.

Furthermore, the material for the bond and the coupling medium can be identical. Thus the production which can also be effected by means of Pick & Place methods is facilitated since only one step is required for the application of bonding material and coupling medium, which in this case is identical.

The material for formation of the bond can be covered completely by the projection of the secondary optics. As a result, the influence of environmental conditions (such as e.g. solar radiation) on the bonding material, which could for example effect embrittlement of the material, is effectively prevented.

Preferably, the refractive secondary optics is enclosed in a form-fit by a casing, the upper side of the casing forming the entrance aperture and the lower side of the casing the outlet aperture. The casing can have for example a circular, oval or square-cut base and consequently be cylindrical or prism-shaped. For preference, the casing is cylindrical.

The refractive secondary optics can have a convexly-configured entrance aperture which protrudes beyond the casing in the longitudinal direction. Hence a lens-shaped entrance aperture for concentration of the incident light is formed in a simple manner.

The secondary optics can be connected to the solar cell and/or to the substrate via at least one fastening element. Furthermore, the substrate can have at least one form-fitting, reversible locking device to which at least one fastening element can be connected.

In a preferred embodiment, at least one protective diode and/or at least one primary optics for concentration of light onto the secondary optics, such as e.g. a Fresnel collector, a lens and/or a mirror, is contained in the solar cell assembly. These components serve for a first focusing of the light onto the secondary optics.

In a variant of the solar cell assembly, the solar cell is connected electrically in series and/or in parallel to at least one further solar cell via the at least one contact.

Furthermore, the invention includes a solar cell arrangement which is characterised in that it is constructed from 2 to 10,000 of the described solar cell assemblies.

Both the solar cell assembly and the solar cell arrangement can be disposed on tracking systems.

The subject according to the application is intended to be explained in more detail with reference to the following FIGS. 1 to 3 and examples 1 to 3, without wishing to restrict said subject to these variants.

Figure 1:
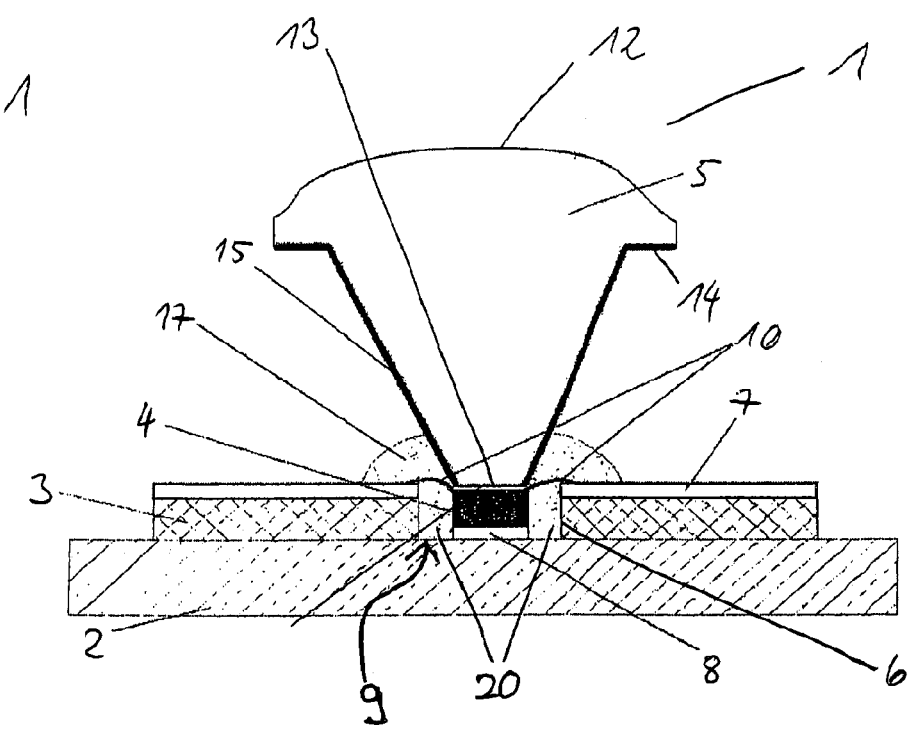
FIG. 1 shows a solar cell assembly with a refractive secondary optics which has a projection.

FIG. 1 shows a solar cell assembly 1 comprising an electrically conductive substrate 2 which serves as heat sink and is made of copper. The solar cell 4 is a III-V multiple solar cell. The metallised surface 7 made of a Cu/Ni/Au layer sequence on the insulator 3 serves as contact pad and has a recess 6 in the middle. The refractive secondary optics 5 is a glass body which is configured as a truncated cone with a lens-shaped entrance aperture 12. The outlet aperture 13 hereby has the same shape and dimension as the solar cell 4. The lateral area of the truncated cone is provided with a silver-containing, highly reflective coating with an additional layer as protective layer 15 and thus protected from environmental influences. On the side of the entrance aperture 12, the refractive secondary optics 5 has a projection 14 which facilitates gripping during the Pick & Place method and offers additional protection for the subsequent encapsulation by the material for the bond 17. The refractive secondary optics 5 can be produced in a glass moulding process (more generally: glass hot shaping), ideally a plurality of optics being produced in one moulding process. The process time is consequently shortened.

The solar cell 4 is mounted with electrically conductive adhesive 8 on the solar cell 4. As an alternative, the solar cell 4 can be soldered. As a result, the rear-side contact of the solar cell 4 is produced via the copper plate as the electrically conductive substrate 2. The electrical insulator 3 with the metallised surface 7 is glued onto the heat sink as the electrically conductive substrate 2 so that the solar cell 4 is situated in the middle of the recess 6. In a bonding process, an electrical contact 10 between the solar cell front-side and the metallised surface 7 is produced with thin wire bonding (ideally gold wire).

A small quantity of optical coupling medium 20 is applied on the solar cell front-side or the outlet aperture 13. Liquid transparent silicone can be used for this purpose. The refractive secondary optics 5 is placed on the solar cell upper side with the outlet aperture 13. Subsequently, the material for the bond 17 is applied around the solar cell 4 and the refractive secondary optics 5, also the electrical contact 10 being encapsulated. An injection or dispensing process is suitable inter alia for the encapsulation process. Finally, the coupling medium 20 is hardened. In the case of the example of FIG. 1, the material for the bond 17 and the coupling medium 20 is thereby identical. Consequently, a simple and economic process becomes possible since only one material is required.

Figure 2:
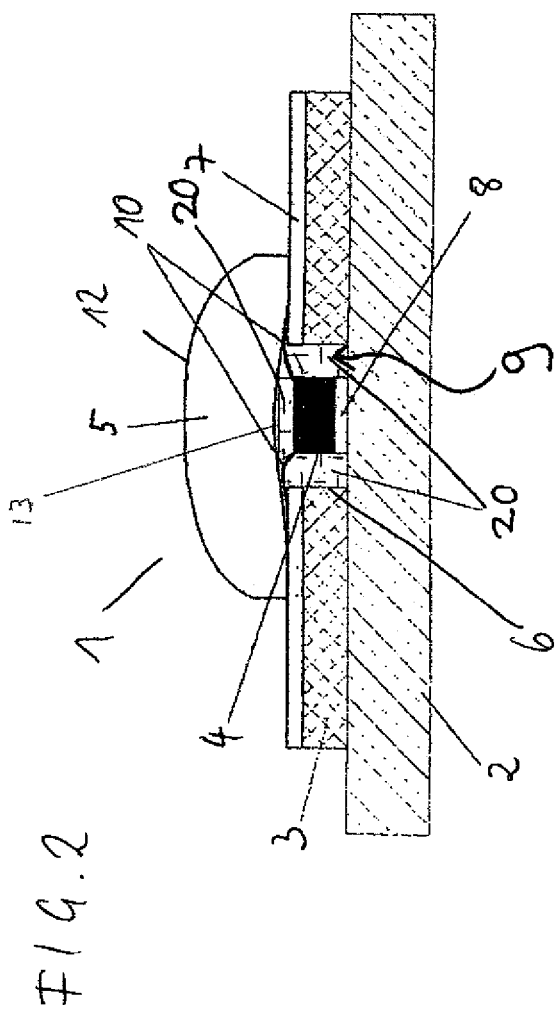
FIG. 2 shows a solar cell assembly with a refractive secondary optics which has a convex entrance aperture.

In FIG. 2, a solar cell assembly 1 with refractive secondary optics 5 which has a convex entrance aperture 12 is represented. An electrically conductive substrate 2 serves as heat sink and consists of copper. The solar cell 4 is a III-V multiple solar cell. The metallised surface 7 made of a Cu/Ni/Au layer sequence on the insulator 3 serves as contact pad and has a recess 6 in the middle. The refractive secondary optics 5 is a glass body in cylindrical form with a convex, lens-shaped entrance aperture 12 and a flat outlet aperture 13. Both the entrance aperture 12 and the outlet aperture 13 are greater than the surface of the solar cell 4.

The refractive secondary optics 5 can be produced in a glass moulding process, ideally a plurality of lens systems being produced in one moulding process. The process time can consequently be shortened.

The solar cell 4 is mounted with electrically conductive adhesive 8 on the solar cell 4. As a result, the rear-side contact of the solar cell 4 is produced via the copper plate as the electrically conductive substrate 2. The electrical insulator 3 with the metallised surface 7 is glued onto the heat sink as the electrically conductive substrate 2 so that the solar cell 4 is situated in the middle of the recess 6. In a bonding process, an electrical contact 10 between the solar cell front-side and the metallised surface 7 is produced with thin wire bonding (ideally gold wire).

Transparent and liquid silicone as the coupling medium 20 is filled into the interspace 9 between solar cell 4 and insulator 3 so that some of the silicone emerges out of the interspace 9. The refractive secondary optics 5 with the outlet aperture 13 is pressed into this emerging silicone as the coupling medium 20 so that an optical contact is produced. The solar cell 4 is encapsulated here entirely by the coupling medium 20. The spacing between the outlet aperture 13 of the refractive secondary optics 5 and the solar cell 4 is determined by the thickness of the insulator 3 and influences the entire design of the concentrator optics. Finally the silicone is hardened.

Figure 3:
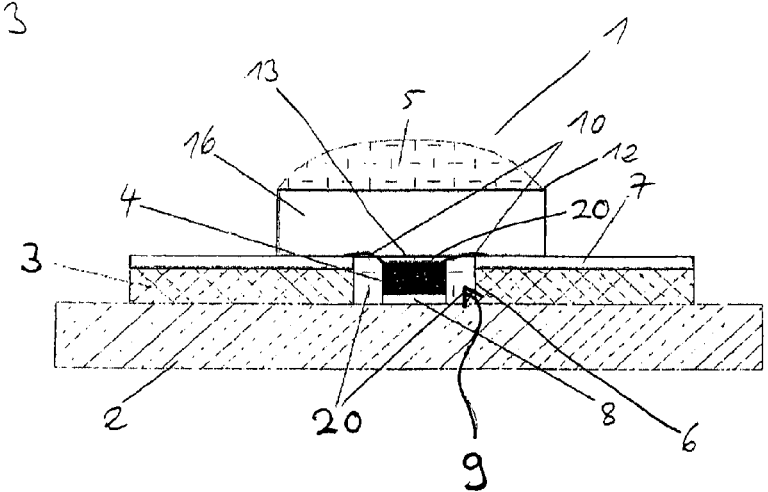
FIG. 3 shows a solar cell assembly which has an encased refractive secondary optics.

FIG. 3 shows a solar cell assembly 1 which has an encased refractive secondary optics 5. The electrically conductive substrate 2 as heat sink consists of copper. The solar cell 4 is a III-V multiple solar cell. The metallised surface 7 made of a Cu/Ni/Au layer sequence on the insulator 3 serves as contact pad and has a recess 6 in the middle. The metal cylinder made of aluminium as casing 16 has a greater inner diameter than the recess 6. The interspace 9 between the solar cell 4 and the insulator 3 which is provided with a metallised surface 7 is filled with coupling medium 20.

The solar cell 4 is mounted with electrically conductive adhesive 8 on the solar cell 4. Alternatively, the solar cell 4 can also be soldered. As a result, the rear-side contact between solar cell 4 and copper plate as the electrically conductive substrate 2 is produced. The metallised surface 7 made of a Cu/Ni/Au layer sequence on the insulator 3 serves as contact pad and has a recess 6 in the middle. In a bonding process, an electrical contact 10 between the solar cell front-side and the metallised surface 7 is produced with thin wire bonding (ideally gold wire). An aluminium hollow cylinder as a casing 16 is placed on the metallised surface 7 so that the axis of the casing 16 extends through the middle of the solar cell 4. In order to increase the stability, the hollow cylinder of the casing 16 can also be glued on securely. Transparent and liquid silicone as the refractive secondary optics 5 that is filled into the aluminium cylinder of the casing 16 until it begins to emerge from the cylinder of the casing 16 or to bulge beyond the open end-face of the cylinder of the casing 16. A curved surface arises due to the surface tension of the silicone, the ultimate shape of which surface is determined by the filling quantity, the temperature during filling, hardening and use and a possible change in shape during hardening (e.g. volume shrinkage). The total optical design of the solar cell assembly 1 dictates which surface shape is set or what height the aluminium cylinder of the casing 16 must have. The silicone that forms the refractive secondary optics 5 is subsequently hardened.

Example 1

A secondary optics is used, the entrance aperture of the secondary optics being greater than the exit aperture. The secondary optics consists of a transparent dielectric (for example glass, PMMA, polycarbonate etc.) and in principle has a shape tapering from the entrance aperture to the outlet aperture (for example paraboloid, truncated cone, light guide, truncated pyramid etc.). The entrance- and/or outlet aperture can be flat or formed in a curve.

The side surfaces of the secondary optics are provided with a highly reflective, e.g. silver-containing, layer and also with protective layers which protect this highly reflective layer. In order to mount the secondary optics, the latter with the outlet aperture is placed on the solar cell (Pick & Place method). The interspace between secondary optics and solar cell can thereby be filled with an optical coupling medium.

Subsequently, the secondary optics is glued. For this purpose, an adhesive or bonding material is used, which surrounds the outside of the secondary optics, the edges of the solar cell and the electrical contacting (bonded or welded connections). As a result, both the mounting of the secondary optics and the encapsulation of the solar cell and of the electrical connection or contacting are ensured.

Since, in the case of the secondary optics which is used, the outer face is provided with a metallic reflective layer, the encapsulation or adhesive material need not be transparent. The encapsulation is protected from the concentrated solar radiation by the secondary optics. In addition, the secondary optics on the upper side can have a projection (e.g. in the form of a circumferential ring) which protects the encapsulation material in addition from the concentrated radiation. Such a projection can furthermore be advantageous for mounting in which it serves as grippable region for the Pick & Place method. Furthermore, the projection can be used to mount the secondary lens system mechanically in addition.

Example 2

A lens-shaped secondary optics is used. The secondary optics consists of a transparent dielectric (for example glass, PMMA, polycarbonate etc.) and has a convexly-shaped entrance aperture. Concentrated light which impinges on the entrance aperture is in addition concentrated or light from a greater (incident) solid angle is directed towards the outlet aperture.

The contact pad for producing the front-side contact should thereby surround the solar cell completely. In addition, the contact pad should at least be as thick as the solar cell which is used. The volume between cell and contact pad is somewhat overfilled with encapsulation material or coupling medium, a small quantity thereof emerging from the volume. The secondary optics can in addition be glued. For example transparent silicone can be used as encapsulation material.

Example 3

A secondary optics is configured in that a cylindrical casing is placed such that it encloses the solar cell and the electrical bonded or welded connections which serve for the electrical contacting. Subsequently, the volume between the solar cell and the casing is filled with optically transparent, dielectric material. According to the filling quantity and wetting characteristics of the material, curved surfaces which engage conveniently in the light path and direct or focus light onto the solar cell can be produced. The material for the encapsulation, e.g. made of transparent silicone, hence serves for protection of the solar cell and for protection of the electrical contacting.

The invention claimed is:
1. A solar cell assembly comprising:
an electrical insulator that is disposed on an electrically conductive substrate and is provided with a metallised surface, and
at least one solar cell with refractive secondary optics to focus sunlight on the solar cell, the refractive secondary optics comprising a refractor that is configured solidly from an optically transparent dielectric material with an average transmissibility of at least 90% in the wavelength range between 400 and 2,500 nm, measured with a layer thickness of 1 mm, the refractor including an entrance aperture configured to be orientated towards sunlight and an outlet aperture configured to be orientated towards the solar cell, the entrance aperture or the outlet aperture, or both, being configured such that a refractive concentration of incident sunlight is effected,
wherein the at least one solar cell is connected to the electrically conductive substrate,
wherein the solar cell is disposed in a recess in the electrical insulator that is provided with the metallised surface, the solar cell being connected to the electrically conductive substrate by a side orientated towards the electrically conductive substrate via an electrically conductive connection and the recess being dimensioned such that an interspace is produced laterally between the solar cell and the electrical insulator that is provided with the metallised surface, wherein the solar cell, at least on a side connected to the refractive secondary optics, has at least one protective coating made of an optically transparent metal, aluminium oxide, silicon, silicon oxide, silicon nitride, silicon carbide, one or more polycarbonates, one or more poly(meth)acrylates, silicone, glass, quartz glass, or one or more thermoplastic plastics,
the interspace being filled with a coupling medium and the solar cell being connected to the metallised surface by at least one electrical contact, wherein the coupling medium encapsulates the solar cell and the at least one electrical contact.

2. The solar cell assembly according to claim 1, wherein the coupling medium is selected from the group consisting of one or more transparent materials, silicones, silicone oil, polycarbonates, poly acrylates, poly(meth)acrylates, glass, quartz glass, thermoplastic plastics, or a combination thereof.

3. The solar cell assembly according to claim 1, wherein the electrically conductive connection of the solar cell to the electrically conductive substrate includes one or more of an adhesive, solder, a bond connection, or welding.

4. The solar cell assembly according to claim 1, wherein the metallised surface consists of one or more metals selected from the group consisting of copper, silver, nickel, gold, platinum, titanium, palladium, aluminium, germanium, or one or more alloys or one or more combinations of these.

5. The solar cell assembly according to claim 1, wherein the electrically conductive substrate consists of one or more of copper, aluminium, titanium, steel, silicon alloys, or metal alloys.

6. The solar cell assembly according to claim 1, wherein the electrical insulator consists of one or more epoxy resins, thermoplastic plastics, ceramics, aluminium oxide, polyethylenes, polyvinylchlorides, polytetrafluoroethylenes, silicones, or glass.

7. The solar cell assembly according to claim 1, wherein the optically transparent dielectric material for the refractive secondary optics is selected from the group consisting of epoxy resin, silicone, silicone resin, polycarbonate, one or more polyacrylates, one or more poly(meth)acrylates, glass, quartz glass, one or more thermoplastic plastics, silicon oxide, silicon carbide, aluminium oxide, or one or more combinations of thereof.

8. The solar cell assembly according to claim 1, wherein the entrance aperture or outlet aperture, or both, of the refractive secondary optics has one or more of a flat, convex, or concave surface contour.

9. The solar cell assembly according to claim 1, wherein an area of the entrance aperture of the refractive secondary optics is greater than an area of the outlet aperture of the refractive secondary optics.

10. The solar cell assembly according to claim 1, wherein the refractive secondary optics includes a projection that surrounds the refractor.

11. The solar cell assembly according to claim 10, wherein the refractor, with the exception of regions of the entrance aperture and outlet aperture or a side of the projection orientated towards the outlet aperture, is coated with a highly reflective coating with a reflection degree ρ>70% in a wavelength range of 400 to 800 nm or a reflection degree ρ>80% in a wavelength range of 900 to 2,500 nm.

12. The solar cell assembly according to claim 11, wherein the highly reflective coating of the refractive secondary optics comprises aluminium or a layer sequence of materials with different refractive indices $n^{20}D$ or alloys of these.

13. The solar cell assembly according to claim 11, wherein the highly reflective coating of the refractive secondary optics has a layer thickness of 1 nm to 3 mm.

14. The solar cell assembly according to claim 1, wherein the refractor is fixed on the metallised surface by a bond by at least one of gluing or mechanical fixing.

15. The solar cell assembly according to claim 14, wherein a material for formation of the bond is selected from the group consisting of one or more thermoplastic plastics, epoxy resins, silicones, acrylates, cyanoacrylates, polycarbonates, polyacrylates, poly(meth)acrylates, or one or more combinations thereof.

16. The solar cell assembly according to claim 14, wherein a material for formation of the bond is a thermally conducting material that is electrically insulating.

17. The solar cell assembly according to claim 15, wherein a material for the bond and the coupling medium are the same.

18. The solar cell assembly according to claim 14, wherein the material for formation of the bond, in a projection direction, is covered completely by the projection of the secondary optics.

19. The solar cell assembly according to claim 1, wherein the refractive secondary optics is enclosed by a casing in a form fit, an upper side of the casing forming the entrance aperture and a lower side of the casing forming the outlet aperture.

20. The solar cell assembly according to claim 19, wherein the entrance aperture is convexly configured and protrudes beyond the casing in a longitudinal direction.

21. The solar cell assembly according to claim 1, wherein the refractive secondary optics is connected to one or more of the solar cell or the electrically conductive substrate via at least one fastening element.

22. The solar cell assembly according to claim 1, wherein one or more of at least one protective diode or at least one primary optics for concentration of light onto the refractive secondary optics is included in the solar cell assembly.

23. The solar cell assembly according to claim 1, wherein the solar cell is connected electrically in series or in parallel to at least one further solar cell via the at least one electrical contact.

24. A solar cell arrangement comprising from 2 to 10,000 solar cell assemblies, each solar cell assembly comprising:
   an electrical insulator that is disposed on an electrically conductive substrate and is provided with a metallised surface, and
   at least one solar cell with a refractive secondary optics to focus sunlight on the solar cell, the refractive secondary optics comprising a refractor that is configured solidly from an optically transparent dielectric material with an average transmissibility of at least 90% in the wavelength range between 400 and 2,500 nm, measured with a layer thickness of 1 mm, the refractor including an entrance aperture configured to be orientated towards sunlight and an outlet aperture configured to be orientated towards the solar cell, the entrance aperture or the outlet aperture, or both, being configured such that a refractive concentration of incident sunlight is effected,
   wherein the at least one solar cell is connected to the electrically conductive substrate,
   wherein the solar cell is disposed in a recess in the electrical insulator that is provided with the metallised surface, the solar cell being connected to the electrically conductive substrate by a side orientated towards the electrically conductive substrate via an electrically conductive connection and the recess being dimensioned such that an interspace is produced laterally between the solar cell and the electrical insulator that is provided with the metallised surface, wherein the solar cell, at least on a side connected to the refractive secondary optics, has at least one protective coating made of an optically transparent metal, aluminium oxide, silicon, silicon oxide, silicon nitride, silicon carbide, one or more polycarbonates, one or more poly(meth)acrylates, silicone, glass, quartz glass, or one or more thermoplastic plastics,
   the interspace being filled with a coupling medium and the solar cell being connected to the metallised surface by at least one electrical contact, wherein the coupling medium encapsulates the solar cell and the at least one electrical contact.

* * * * *